United States Patent
Lin et al.

(10) Patent No.: US 8,247,908 B2
(45) Date of Patent: Aug. 21, 2012

(54) CIRCUIT SUBSTRATE AND METHOD FOR UTILIZING PACKAGING OF THE CIRCUIT SUBSTRATE

(75) Inventors: Yao-Sheng Lin, Hsinchu Hsien (TW); Tai-Hong Chen, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 12/843,251

(22) Filed: Jul. 26, 2010

(65) Prior Publication Data
US 2010/0283159 A1    Nov. 11, 2010

Related U.S. Application Data

(63) Continuation-in-part of application No. 11/468,341, filed on Aug. 30, 2006, now abandoned.

(30) Foreign Application Priority Data
Jan. 26, 2006 (TW) .............................. 95103012 A

(51) Int. Cl.
H01L 23/52    (2006.01)
(52) U.S. Cl. .. 257/775; 257/773; 257/777; 257/E23.015

(58) Field of Classification Search .................. 257/773, 257/775–779, E23.01, E23.015, E23.06, 257/E23.065, E23.066, E23.177
See application file for complete search history.

(56) References Cited

U.S. PATENT DOCUMENTS
5,323,084 A * 6/1994 Haitz ............................ 313/500
* cited by examiner Primary Examiner — Matthew E Warren
(74) Attorney, Agent, or Firm — WPAT, P.C.; Anthony King

(57) ABSTRACT

A circuit substrate and the method for fabricating a packaging of the circuit substrate are provided. A plurality of electrodes are formed on the surface of the circuit substrate, the electrodes are formed with fork structures over an connection section of the circuit substrate, so that when the circuit substrate expands/contracts due to thermal processes, the probability of alignment with electrodes of an external circuit board is increased by easily detaching the fork structure overlapping an electrode of the external circuit board which is not corresponding to the fork structure of the electrode of the circuit substrate, so as to avoid short circuit. Thus, electrode misalignment due to electrode pitch variation of the traditional circuit substrate as a result of thermal deformation can be effectively eliminated.

11 Claims, 7 Drawing Sheets

CIRCUIT SUBSTRATE AND METHOD FOR UTILIZING PACKAGING OF THE CIRCUIT SUBSTRATE

CROSS-REFERENCE TO RELATED APPLICATIONS

This application is continuation-in-part application of U.S. patent application Ser. No. 11/468,341, field Aug. 30, 2006 and hereby incorporates the content of this application by reference.

TECHNICAL FIELD

The disclosure relates to a circuit substrate and the method for utilizing the packaging of the circuit substrate, and more particularly, to a flexible substrate and its packaging applicable to a display and the method for utilizing the flexible substrate packaging.

BACKGROUND

Flat Panel Displays (FPDs) have become one of the most important electronic applications due to the progress of technology. The FPDs have been applied to various fields, such as TVs, outdoor panels, display screens of electronic instruments and electronic watches etc. The optoelectronic industry has made great effort in research and development, the FPDs has evolved from the early Cathode Ray Tubes (CRTs) to the now popular Liquid Crystal Displays (LCDs). Furthermore, a type of FPDs called Organic Light Emitting Diodes (OLEDs) have promising future due to advantages such as self-illuminating, high contrast, high luminance, low driving voltage and compactness etc.

In addition, although Thin-Film Transistor-LCDs (TFT-LCDs) driven by thin-film transistors based on glass substrates are currently a popular choice for many, "soft" substrates such as plastic and flexible substrates which compared to glass substrates are lighter and less fragile have become the focus of the next generation applications.

Currently, flexible substrates mainly use plastic substrates made of Polyethersulfone (PES), which has a glass transition temperature of about 200~220° C., and thermal expansion coefficient of about 50~60 ppm/° C. However, since flexible substrates tend to change with temperature, expansion of the plastic substrates may occur due to high temperature cycles in the display manufacturing processes, such that the pitch between electrodes thereon may become too large to allow effective alignment of the electrodes of the flexible substrates with electrodes of a flexible circuit board for electrical connections, creating problems such as electrical failure or short circuit.

Referring to FIG. 1, the problem of the pitch between neighboring electrodes 100 on a traditional flexible substrate 10 becoming too large or too small due to temperature variation is illustrated. As a result, the flexible substrate 10 is thermally deformed, such that there is no sufficient area to interface electrodes 110 on a flexible circuit board 11 with the electrodes 100 of the flexible substrate 10 causing electrical failure or more than one electrodes 110 on the flexible circuit board 11 overlap the same electrode on flexible substrate 10 causing electrical short circuit.

Many have tried to find a solution to the problem of thermal stress or deformation due to different thermal expansions of various materials. For example, U.S. Pat. No. 5,644,373 discloses a LCD device that has a pair of substrate mutually separated from each other by a predetermined distance, so that a liquid crystal can be disposed between the substrates, wherein the substrate is a different material with thermal expansion difference within positive or negative 50% to avoid the problem of misalignment. However, this method uses a glass substrate and does not address the problem of thermal stress and expansion of flexible substrates.

Moreover, U.S. Pat. No. 6,489,573 discloses an electrode bonding structure that reduces the effect of thermal expansion in bonding process of the flexible circuit board. The electrode bonding structure comprises a substrate, a circuit board and an Anisotropic Conductive Film (ACF). A dielectric layer and indenting pads are formed on the surface of the substrate. The inner surface of the indenting pads is lower than the surface of the dielectric layer of the substrate by a depth H3. The circuit board is parallel to the substrate with a circuit dielectric layer and bump pads formed thereon. The bump pads are higher than surface of the circuit dielectric layer by about H1. The ACF with a thickness of H2 is disposed between the substrate and the circuit board. In bonding, the bump pads are correspondingly coupled to the indenting pads, and $H1 \geq (H2+H3)$, thereby reducing the effect of thermal expansion in bonding the circuit board.

Nonetheless, the above technique is only applied to the bonding between a glass substrate and a flexible circuit board; it does not address the thermal expansion in bonding a flexible substrate and a flexible circuit board.

Another approach commonly used in this field is to estimate the pitch of the electrodes after thermal deformation and make flexible circuit board with corresponding electrode pitch accordingly. However, such a method has a complicated manufacturing process and higher production cost.

Moreover, during bonding of flexible substrates and circuit boards, if the manufacturing machine is not properly controlled or faulty, misalignment may occur between the substrates and the circuit boards. As a result, the whole batch may have to be discarded, increasing the production cost.

Therefore, there is a need for a flexible circuit substrate and the method for utilizing a packaging of the flexible circuit substrate that enhance reliability in the alignment process and effectively solves the problem of thermal deformation of the flexible substrates as described above.

SUMMARY

In accordance with an embodiment, it provides a circuit substrate formed with a plurality of electrodes thereon, each of the electrodes being formed with a base and fork structures, wherein at least one of the fork structures is detachable from the base of an electrode on the circuit substrate, such that the electrical connection of the one of the fork structures and the base is broken.

The circuit substrate may comprises a connection section, such that the one of the fork structures is capable of being detached from the base of the electrodes at the connection section of the circuit substrate, such that the one of the fork structures is capable of being detached from the base of the electrodes at the connection section of the circuit substrate, and thereby the electrical connection of the one of the fork structures and the base is broken.

The another embodiment further discloses a method for utilizing a circuit substrate packaging, comprising: providing a circuit substrate and a circuit board, a surface of the circuit substrate and a surface of the circuit board facing the surface of the circuit substrate being respectively formed with a plurality of electrodes, wherein each of the electrodes of the circuit substrate is composed of a base and a plurality of fork structures and at least one of the fork structures is detachable from the base of an electrode on the circuit substrate; correspondingly bonding the electrodes of the circuit board to the electrodes of the circuit substrate with the fork structures; and detaching the at least one of the fork structures from the based of one of the electrodes of the circuit substrate that is bonded to an electrode of the circuit board other than the correspondingly bonded electrode of the circuit board.

The provided circuit substrate may comprises a connection section, such that the one of the fork structures is capable of being detached from the base of the electrodes at the connection section of the circuit substrate, and thereby the electrical connection of the one of the fork structures and the base is broken.

BRIEF DESCRIPTION OF THE DRAWINGS

The disclosure can be more fully understood by reading the following detailed description of the embodiments, with reference made to the accompanying drawings, wherein.

DETAILED DESCRIPTION OF THE EMBODIMENTS

The disclosure is described by the following specific embodiments. Those with ordinary skill in the arts can readily understand the other advantages and functions of the disclosure after reading the disclosure of this specification. The disclosure can also be implemented with different embodiments. Various details described in this specification can be modified based on different viewpoints and applications without departing from the scope of the disclosure.

In the light of forgoing drawbacks, the disclosure is to provide a circuit substrate and the method for utilizing a packaging of the circuit substrate to enhance alignment of the circuit substrate after thermal deformation.

Another objective of the disclosure is to provide a circuit substrate and its packaging and the method for utilizing the packaging that reduces the effect of expansion or contraction of plastic material of the circuit substrate after thermal processes on the subsequent electrical alignment.

Still another objective of the disclosure is to provide a circuit substrate and its packaging and the method for utilizing the packaging that eliminates the need of making a circuit board with customized electrode pitch for bonding with a conventional circuit substrate after thermal deformation, thus avoiding complicated fabricating process and high production cost.

Yet another objective of the disclosure is to provide a circuit substrate and the method for utilizing a packaging of the circuit substrate that avoids discarding a whole batch of substrates having misaligned electrodes with circuit boards due to fault or poorly operated fabricating machinery.

Figure 1:
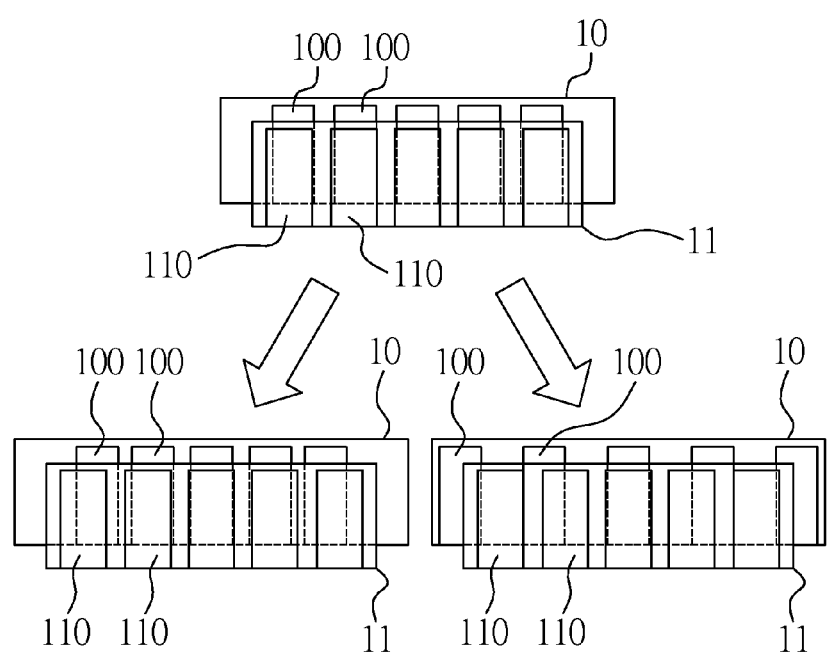
FIG. 1 (PRIOR ART) is a plane schematic diagram illustrating the problem of electrode misalignment between a conventional flexible substrate and a circuit board in which the pitch between neighboring electrodes on the traditional flexible substrate becoming too large or too small due to temperature variation.
Figure 2A:
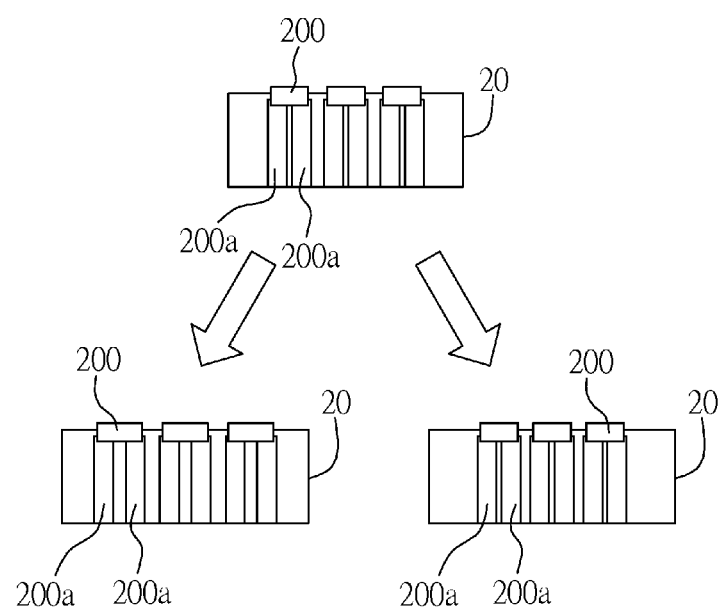
FIG. 2A is a plane schematic diagram of a first embodiment of the circuit substrate of the disclosure.

Referring to FIG. 2A, it illustrates a plane schematic diagram of a first embodiment of a circuit substrate 20 of the disclosure. A plurality of electrodes 200 are formed on the circuit substrate 20. The electrodes 200 are characterized in that fork structures 200a are formed. The electrodes 200 used for external electrically connections extend outward and are split into two such that the alignment probability of the electrodes with electrodes of an external circuit board is improved.

The circuit substrate 20 is an insulating plastic substrate, such as a flexible substrate applicable to a flexible display. The insulating plastic material used for the circuit substrate 20 may for example be Polyethersulfone (PES), which has a glass transition temperature of about 200~220° C., and a thermal expansion coefficient of about 50~60 ppm/° C. It should be noted that the circuit substrate 20 of the disclosure is not limited to a flexible substrate, but can be applied to any kind of circuit substrate having electrode pitch varied with the thermal environment.

The fork structures 200a formed in the electrodes 200 for electrical signal propagation on the circuit substrate 20 allows better alignment with electrodes of an external circuit board, even if the circuit substrate 20 expands/contract due to thermal processes. Good electrical bonding with the external circuit board can be provided by the fork structures 200a.

Figure 2B:
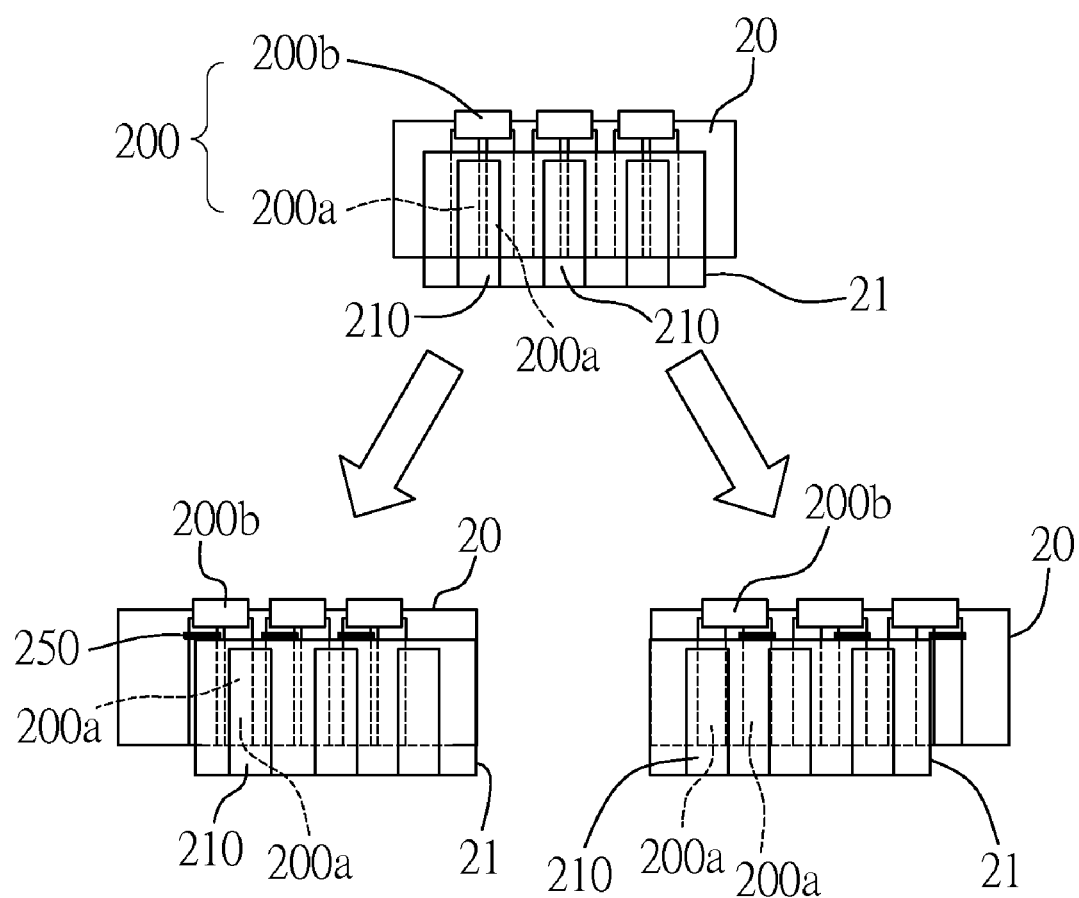
FIG. 2B is a plane schematic diagram of a first embodiment of the circuit substrate packaging of the disclosure.

Referring to FIG. 2B, its shows a packaging of the first embodiment of the circuit substrate. The packaging comprises a circuit substrate 20 with a plurality of electrodes 200 thereon, wherein each the electrodes 200 are formed with fork structures 200a and a base 200b; and a circuit board 21 with a plurality of electrodes 210 thereon. The electrodes 210 of the circuit board 21 are correspondingly bonded to the electrode fork structures 200a of the circuit board 20. The fork structure 200a is capable of being detached from the base of one of the electrodes 200, if necessary; further explanations in this regard are provided as follows. A connection section 250 of the circuit substrate 20 may be provided beneath one of the fork structures 200a near the base 200b of the electrode of the circuit substrate.

In the packaging, even if the circuit substrate 20 is under high temperature thermal processes, such that the material substantially expands/contracts and causing the electrode pitch to vary, the electrodes 210 of the circuit board 21 can still be easily aligned to the electrodes 200 of the circuit substrate 20 via the inventive fork structures 200a. Moreover, in the case of the fork structure 200a of the same electrode of the circuit substrate 20 being bonded to different electrodes 210 of the circuit board 21 (i.e., other than the corresponding bonded one), the electrical connection of the overlapped part need to be broken, thus avoiding electrical short circuit. Additionally, the circuit board 21 is for example a flexible circuit board (FPC).

It should be noted that the fork structures formed in the electrodes of the circuit substrate extend outward and split into two in this embodiment, but the electrode can also be formed with fork structures without extending outward. In such a way, electrical bonding can still be provided, overlapping portion of the separable fork structure of the same electrode of the circuit substrate bonded to different electrodes of the circuit board can be cut off, cut through or peeled off to avoid electrical short circuit. Thus, good electrical bonding with the circuit board can be provided effectively by using the fork structures.

Figure 3A:
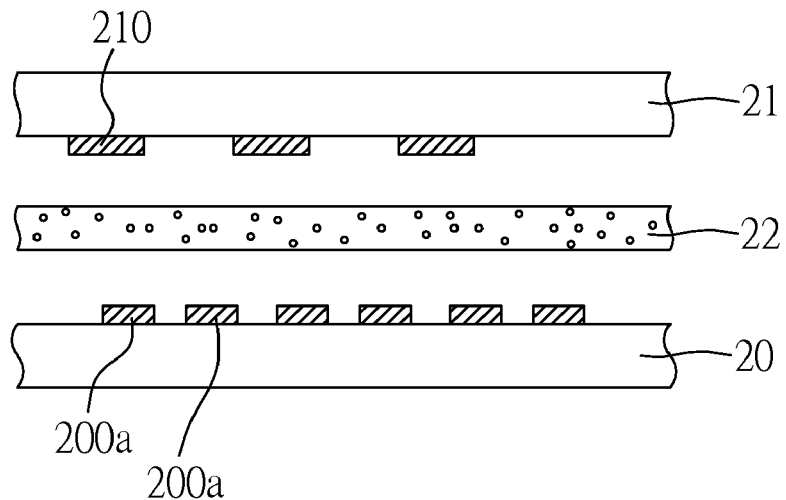
FIGS. 3A to 3C are cross sectional schematic diagrams for illustrating the utilizing process of the circuit substrate packaging of the disclosure.
Figure 3B:
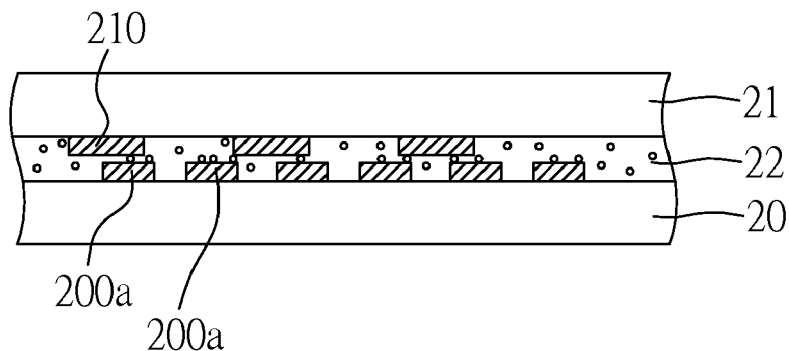
Figure 3C:
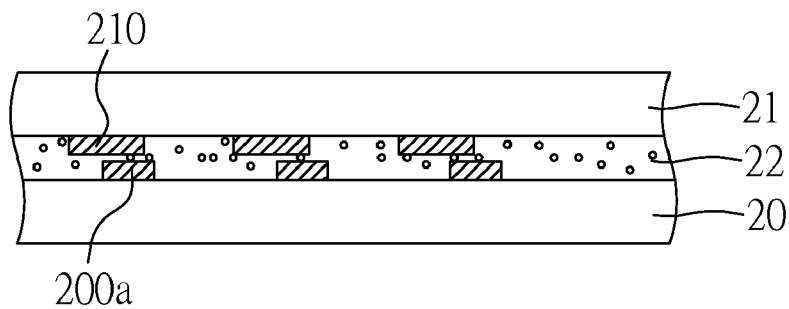

Referring to FIGS. 3A to 3C, cross sectional schematic diagrams for illustrating the fabricating process of the circuit substrate packaging of the disclosure are shown. As shown in FIG. 3A, a circuit substrate 20 and a circuit board 21 are first provided. A plurality of electrodes 200 and electrodes 210 are respectively formed on the surface of the circuit substrate 20 and the circuit board 21. The electrodes 200 of the circuit substrate 20 are composed of fork structures 200a and a base 200b thereon.

As shown in FIG. 3B, a high molecular gel is disposed between the circuit substrate 20 and the circuit board 21, such as an Anisotropic Conductive Film (ACF) 22, thermal pressing of the circuit substrate 20 and the circuit board 21 is performed, so that the electrodes 210 of the circuit board 21 correspondingly bond and electrically conduct the electrode fork structures 200a of the circuit substrate 20.

As shown in FIG. 3C, the fork structure 200a overlaps and thus bonds to an incorrect one of the electrodes 210 of the circuit board 21, which is not a corresponding one of the electrodes 210 in design, is detached from the base 200. This detaching can be performed by a laser or a punching tool to avoid any electrical short circuit.

Additionally, as described with the conventional processes, in the case that the fabricating machinery is faulty or wrongly operated, causing misalignment of the electrodes of the circuit board and the circuit substrate, such that the electrodes are overlapped and short circuited, the fork structure overlapping the incorrect electrode of the circuit board can be detached from the base of the electrode to avoid the whole batch being discarded and increase of production cost.

Thus, by virtue of the circuit substrate and its packaging and the method for fabricating the packaging according to the disclosure, in which electrodes for external electrical connections are formed with fork structures to increase the alignment probability with the electrodes of the external circuit board, thus avoiding the problem of misalignment of electrodes of the circuit board and the traditional circuit substrate due to thermal deformation of the electrode pitch.

Furthermore, when the circuit substrate and the circuit board in the disclosure are bonded together, the fork structure of the electrode of the circuit substrate, which overlaps and thus bonds to an incorrect electrode of the circuit board in vicinity of the corresponding electrode of the circuit board in design, is detached (e.g., by punched out, punched through or cut off), thereby avoiding electrical short circuit. As a result, there is no need to provide a customized flexible circuit board with suitable electrode pitch made to correspond to the electrodes of the circuit substrate after deformation. Therefore, the fabricating process is simplified and production cost is reduced.

Figure 4A:
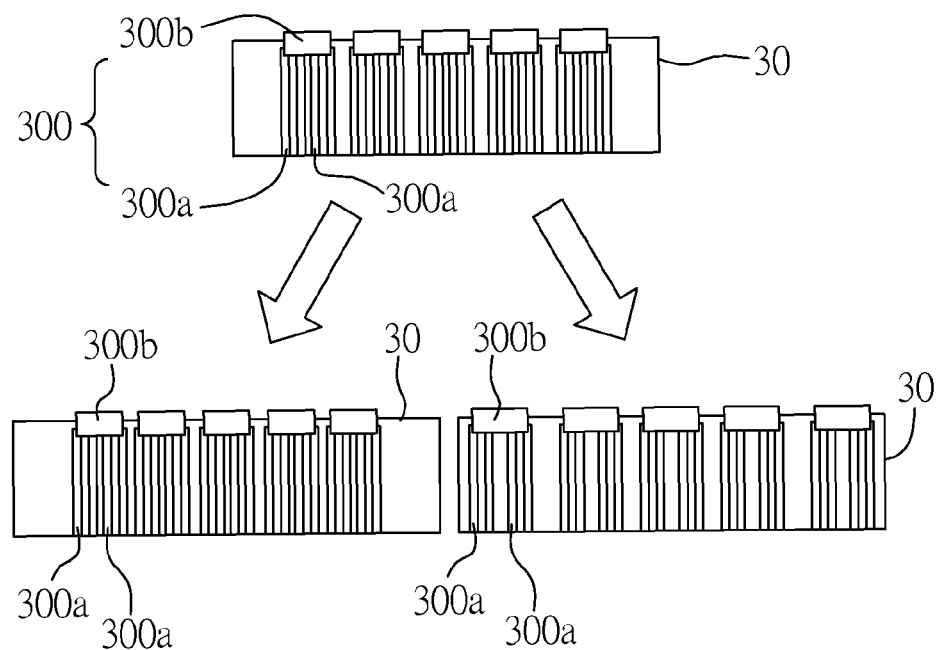
FIG. 4A is a plane schematic diagram of a second embodiment of the circuit substrate of the disclosure.
Figure 4B:
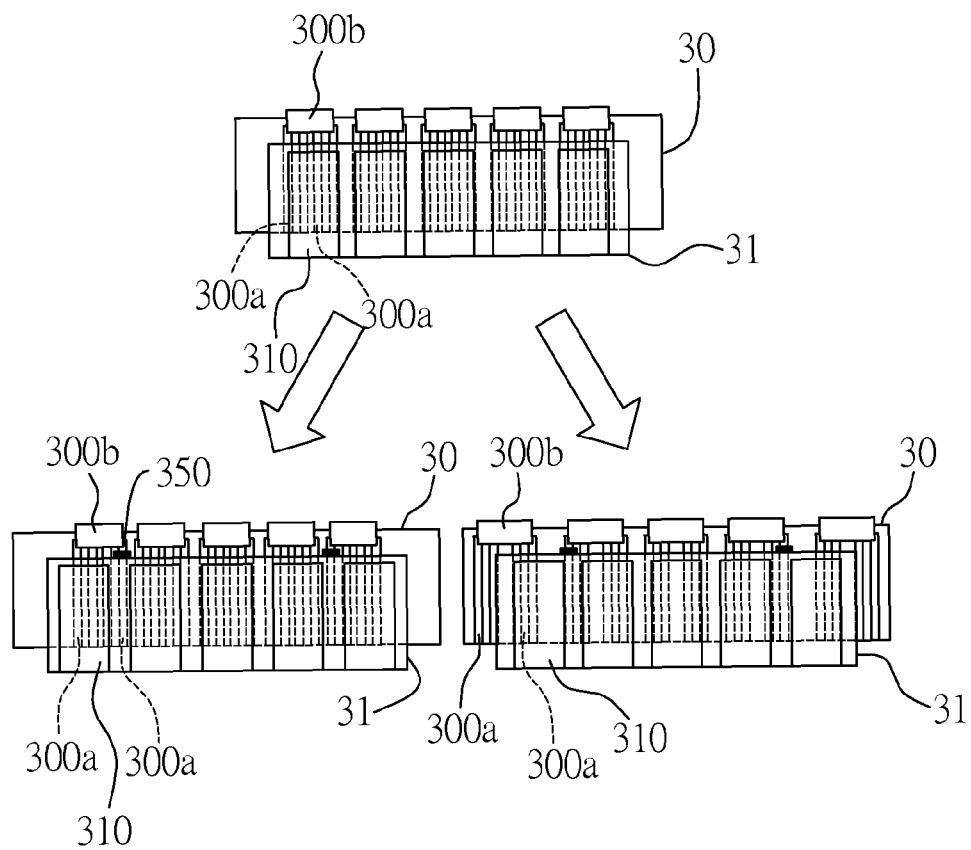
FIG. 4B is a plane schematic diagram of a second embodiment of the circuit substrate packaging of the disclosure.

Referring to FIGS. 4A and 4B, a plane schematic diagram depicting a second embodiment of the circuit substrate and a second embodiment of the circuit substrate packaging of the disclosure is shown.

As shown, the circuit substrate and its packaging of the second embodiment are similar to those of the above embodiment. Each of the electrodes 300 is composed of a base 300b and a plurality of fork structures 300a on the circuit substrate 30. The main difference is in that the fork structures 300a of the electrodes 300 on the circuit substrate 30 are in rail-like shapes. In this way, not only the alignment probability of the electrodes 300 of the circuit substrate 30 with electrodes 310 of an external circuit board 31 can be increased, but the number of conductive particles in the anisotropic conductive film captured underneath the circuit substrate 30 and the circuit board 31, thereby reducing bonding resistance and increasing conductivity. A connection section 350 of the circuit substrate may be provided beneath one of the fork structures 300a at periphery of the electrode of the circuit substrate. The fork structure 300a on the connection section 350, if necessary, is capable of being detached from the base of one of the electrodes 300 by ways of e.g. punched out, punching through, or cut off.

Moreover, in the second embodiment of the disclosure, when rail-like fork structures of the electrode 300 on the circuit substrate 30 are bonded to an incorrect electrode of the circuit board 31, which is the corresponding electrode of the circuit board 31 in design, detaching (e.g., by peeling-off, punching-through, or cutting) of the fork structure of the electrode, which overlaps the incorrect electrode of the circuit board, from the electrodes 300 can be more easily carried out, thereby avoiding electrical short circuit between the electrode of the circuit substrate and the electrodes of the circuit board.

Referring to FIGS. 5A to 5D, schematic diagrams respectively depicts four modified embodiments of the first embodiment shown in FIGS. 2A and 2B, wherein the fork structures of one of the electrodes of the circuit substrate are detachable from a base of the electrode by various detaching ways.

Figure 5A:
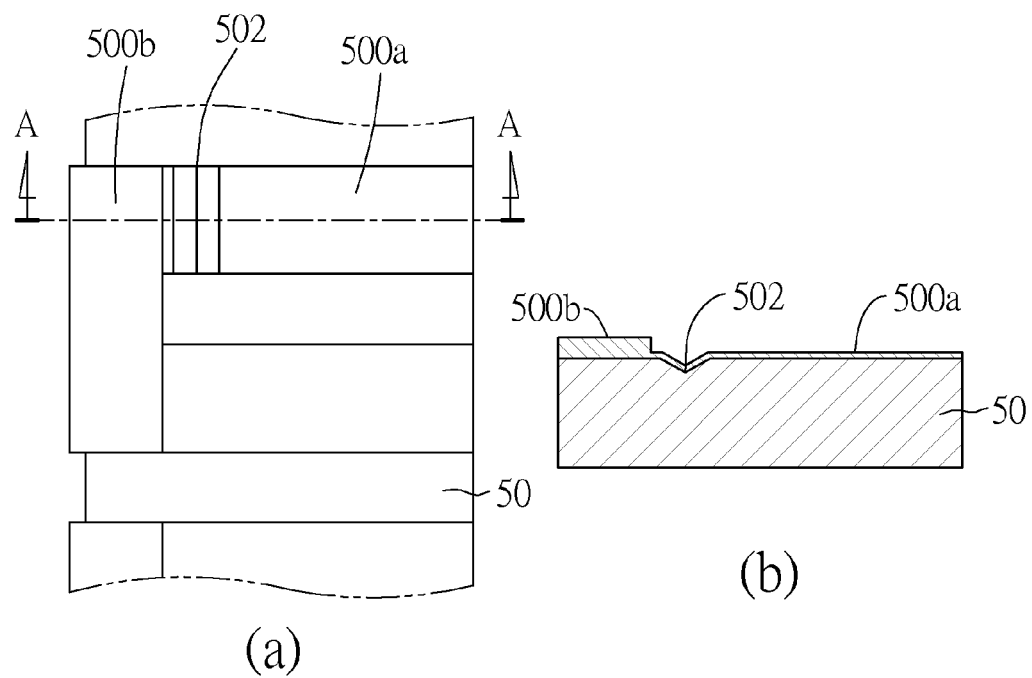
FIG. 5A includes (a) a top and (b) a cross-sectional schematic diagrams of a first embodiment of the connection between each of the fork structures and the electrodes of an embodiment of the disclosure.
Figure 5B:
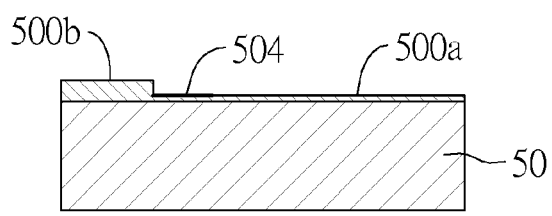
FIG. 5B is a cross-sectional schematic diagram of a second embodiment of the connection between each of the fork structures and the electrodes of the disclosure.

FIG. 5A-(a) is a top view of a substrate 50 with a plurality of electrodes 500, a modified embodiment of the first embodiment, in which each electrodes 500 includes a plurality of fork structure 500a and a plurality of base 500b. FIG. 5A-(b) is a cross-sectional view of the substrate 50 along an A-A line. As shown in FIG. 5A-(b), each of fork structures 500a and a base 500b of an electrode 500 are formed on an integrally formed circuit substrate 50, and the fork structures 500a and the base 500b of the electrodes 500 have different heights (or thickness). In a modified embodiment, the fork structures 500a and the base 500b may have a same height (or thickness). A groove 502 is formed at an upper surface of the circuit substrate 50, which is beneath at least one of the fork structures 500a of the electrode 500. When one of the fork structures 500a of the electrode 500 on the circuit substrate 50 is bonded to an electrode of a circuit board (not shown), which is not the electrode correspondingly designed for bonding the electrode 500 of the circuit substrate 50 (hereinafter referred to as "an incorrect electrode"), the fork structure 500a is detached from the base 500b by easily peeling off or removing a section of the fork structure 500a at the groove 502 of the circuit substrate 50.

As shown in FIG. 5B, each of the fork structures 500a and the base 500b of an electrode 500 are formed on an integrally formed circuit substrate 50, and the fork structures 500a and the base 500b have different heights (or thickness). In a modified embodiment, the fork structures 500a and the base 500b may have a same height (or thickness). A mark 504 is formed on the circuit substrate 50 beneath at least one of the fork structures 500a of the electrode 500. When one of the fork structures 500a of the electrode 500 of the circuit substrate 50 is bonded to an incorrect electrode of the circuit board, rather than correspondingly bonded to an electrode of the circuit board in design, the fork structure 500a is detached from the base 500b by punching through a section of the fork structure 500a at the mark 504 over the circuit substrate 50, so as to avoid the short circuit between the electrode of the circuit substrate and the incorrect electrode of the circuit board.

Figure 5C:
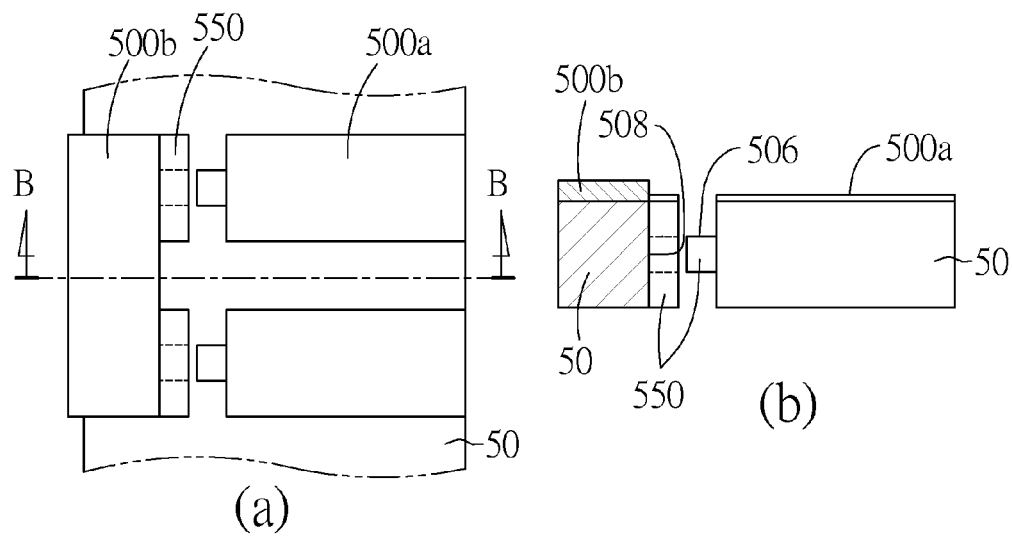
FIG. 5C includes (a) a top and (b) a cross-sectional schematic diagrams of a third embodiment of the connection between each of the fork structures and the electrodes of the disclosure.

FIG. 5C-(a) is a top view of a detached manner for a substrate 50 with a plurality of electrodes 500, a modified embodiment of the first embodiment, in which each electrodes 500 is composed of fork structures 500a and bases 500b. FIG. 5C-(b) is a cross-sectional view of the substrate 50 along a B-B line. As shown in FIG. 5C-(b), each of the fork structures 500a of an electrode 500 are formed on the circuit substrate 50, which has a detachable connection section 550 having, as detached, a projection 506 at one end of the circuit substrate 50 and a recess 508 at another end of the circuit substrate 50. The projection 506 and the recess 508 is correspondingly disposed each other. Further, the circuit substrate 50 on which the fork structures 500a are formed is conformal to the fork structures 500a from the top view of the embodiment, as illustrated in FIG. 5C-(a). The projection 506 can be correspondingly inserted into the recesses 508 by way of, for example, a tenon structure disposed at the detachable connection 550, such that the fork structures 500a is securely and thus electrically connected to the base 500b of the electrodes 500 through the detachable connection section 550. The fork structures 500a and the base 500b have different heights (or thickness); in another modified embodiment, the fork structures 500a and the base 500b may have a same height (or thickness). When one of the fork structures 500a of the electrode 500 of the circuit substrate 50 is bonded to an incorrect electrode of the circuit board, rather than correspondingly bonded to an correct electrode of the circuit board in design, the one of the fork structure 500a is detached from the base 500b by entirely peeling off or removing the circuit substrate 50 under the one of the fork structures 500a at the detachable connection section 550 from the circuit substrate 50, as the detached manner shown in FIG. 5C, thereby avoiding the short circuit between the electrode of the circuit substrate and the incorrect electrode of the circuit board.

Figure 5D:
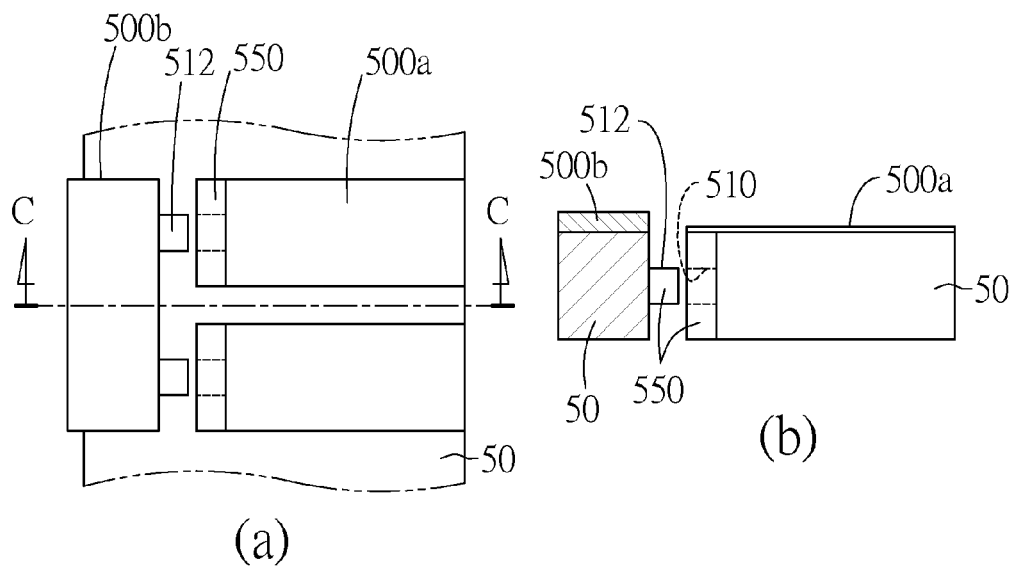
FIG. 5D includes (a) a top and (b) a cross-sectional schematic diagrams of a fourth embodiment of the connection between each of the fork structures and the electrodes of the disclosure.

FIG. 5D-(a) is a top view of a detached manner for a substrate 50 with a plurality of electrodes 500, a modified embodiment of the first embodiment, in which each electrodes 500 is composed of fork structures 500a and bases 500b. FIG. 5D-(b) is a cross-sectional view of the substrate 50 along a B-B line. As shown in FIG. 5D-(b), the fork structures 500a are formed on the circuit substrate 50 with a detachable connection section 550, as detached, having a recess 510 at one end and a projection 512 at another end. Further, the circuit substrate 50 on which the fork structures 500a are formed is conformal to the fork structures 500a from the top view of the embodiment, as illustrated in FIG. 5D-(a). The projection 512 can be correspondingly inserted into the recess 510 by way of, for example, a tenon structure disposed at the detachable connection section 560. Therefore, each of the fork structure 500a is fixed and thus electrically connected to the electrode 500 over the detachable connection section 550 of the circuit substrate 50. The fork structures 500a and the base 500b have different heights (or thickness); in another modified embodiment, the fork structures 500a and the base 500b may have a same height (or thickness). When one of the fork structures 500a of the electrode of the circuit substrate 50 is bonded to an electrode of the circuit board (not shown) an incorrect electrode of the circuit board, rather than correspondingly bonded to an electrode of the circuit board in design, the one of the fork structure 500a is detached from the base by entirely removing the circuit substrate under the one of the fork structures 500a at the detachable connection section 560 from the circuit substrate 50, as the detached manner shown, thereby avoiding the short circuit between the electrode of the circuit substrate and the incorrect electrode of the circuit board.

Given the above, when one of the fork structures of the electrode of the circuit substrate is bonded to an electrode of the circuit board other than the correspondingly bonded one, the fork structure, which is normally at periphery of the electrode, is detachable by punched or peeled away or moved away at the detachable connection section between each of the fork structures and the base of the electrode. Therefore, the electrical short occurs at an electrode of the circuit substrate and that of the external circuit board can be easily eliminated by detaching the fork structure, overlapping the electrode of the electrode of the external circuit board, from the base of the incorrect electrode of the circuit substrate.

The above embodiments are used to illustrate the principles of the disclosure, and they should not be construed as to limit the disclosure in any way. The above embodiments can be modified by those with ordinary skill in the arts without departing from the scope of the disclosure as defined in the following appended claims.

What is claimed is:

1. A circuit substrate: comprising: a plurality of electrodes disposed on a surface of the circuit substrate, each of the electrodes including a base and a fork structure wherein the fork structure includes a first fork element and a second fork element, and the first fork element and the second fork element are detached from each other, and perpendicularly connected to the base, wherein the circuit substrate having a first portion and a second portion further comprises a connection section, the connection section including a projection on one side surface of the first portion and a recess on one side surface of the second portion, wherein the projection of the first portion and the recess of the second portion are connected to each other for the base to electrically connect to the first fork element and the second fork element.

2. The circuit substrate of claim 1, wherein the circuit substrate is a flexible substrate applied to a display device.

3. The circuit substrate of claim 1, wherein the fork structure of the electrodes formed on the circuit substrate has a rail shape.

4. The circuit substrate of claim 1, wherein the circuit substrate is electrically connected with a circuit board via an Anisotropic Conductive Film (ACF).

5. The circuit substrate of claim 1, wherein the circuit substrate adopts Polyethersulfone (PES) as an insulating material.

6. The circuit substrate of claim 1, wherein the fork structure of the electrodes is either extending outward or not extending outward.

7. The circuit substrate of claim 1, wherein the fork structure and the base of the electrodes have different or a same thickness.

8. The circuit substrate of claim 1, wherein the connection section of the circuit substrate comprises a groove or a mark.

9. The circuit substrate of claim 8, wherein the fork structure is detached at the groove or the mark of the connection section from the base.

10. The circuit substrate of claim 1, wherein the connection section is a detachable connection section comprises a tenon structure.

11. The circuit substrate of claim 10, wherein the fork structure is detached at the tenon structure of the detachable connection section, the circuit substrate including a first portion and a second portion, and the tenon structure including a projection on one side surface of the first portion and a recess on one side surface of the second portion.

* * * * *